United States Patent [19]
Ovshinsky et al.

[11] Patent Number: 5,103,284
[45] Date of Patent: Apr. 7, 1992

[54] SEMICONDUCTOR WITH ORDERED CLUSTERS

[75] Inventors: Stanford R. Ovshinsky, Bloomfield Hills; Rosa Young, Troy; Wolodymyr Czubatyj, Warren; Xunming Deng, Troy, all of Mich.

[73] Assignee: Energy Conversion Devices, Inc., Troy, Mich.

[21] Appl. No.: 652,796

[22] Filed: Feb. 8, 1991

[51] Int. Cl.$^5$ .................. H01L 45/00; H01L 29/04
[52] U.S. Cl. ........................... 357/60; 357/2; 357/59
[58] Field of Search ................ 357/2, 59, 60

[56] References Cited

U.S. PATENT DOCUMENTS 4,496,788  1/1985  Hamakawa et al. .............. 357/16

OTHER PUBLICATIONS

U.S. 5,017,308 to S. Fijima et al. U.S. PTO Automated Patent Search & Retrieval System published 21 May 1991.

Primary Examiner—J. Carroll
Attorney, Agent, or Firm—Marvin S. Siskind

[57] ABSTRACT

A semiconductor body includes ordered clusters of less then 100 angstroms in size and preferably, no more than 12 to 30 angstroms in size. The material is characterized by a decoupling of physical properties of the material from the morphology of the material.

18 Claims, 2 Drawing Sheets

SEMICONDUCTOR WITH ORDERED CLUSTERS

FIELD OF THE INVENTION

This invention relates to semiconductors in general. In particular, the invention relates to a semiconductor material having ordered clusters and which manifests novel combinations of basic physical properties heretofore unattainable in a single semiconductor material.

BACKGROUND OF THE INVENTION

Within a relatively brief time, semiconductor materials have made possible the creation of a wide range of optical and electronic devices which have had a major role in the shaping of our world. The impact of semiconductor devices has been felt from the battlefield to the playground and from the kitchen to the cosmos. In the earliest stages, semiconductor technology was limited by the use of single crystalline materials. These materials were, of necessity, highly pure and possessed of a morphology having an extremely regular and long-range periodicity. The dual and interdependent constraints of periodicity and stoichiometry restricted the compositional range, and hence physical properties of crystalline semiconductor materials. As a result single crystalline devices were expensive, difficult to fabricate and limited in their properties.

While then conventional wisdom dictated that semiconductor behavior could only be manifested in highly ordered materials, it was recognized by S. R. Ovshinsky that the requirements of periodicity can be overcome and that semiconductor behavior is manifested by various disordered materials. In this regard, see "Reversible Electrical Switching Phenomena and Disordered Structures" by Stanford R. Ovshinsky; Physical Review Letters, vol. 21, No. 20, Nov. 11, 1968, 1450 (C) and "Simple Band Model for Amorphous Semiconducting Alloys" by Morrel H. Cohen, H. Fritzsche and S. R. Ovshinsky; Physical Review Letters, vol. 22, No. 20, May 19, 1969, 1065 (C). Disordered materials are characterized by a lack of long-range periodicity. In disordered semiconductors the constraints of periodicity and stoichiometry are removed and as a result, it is now possible to place atoms in three dimensional configurations previously prohibited by the lattice constants of crystalline materials. Thus, a whole new spectrum of semiconductor materials having novel physical, chemical and electrical properties is made available. By choice of appropriate material compositions, the properties of disordered semiconductors may be custom tailored over a wide range of values. Disordered semiconductors may be deposited by thin film techniques over relatively large areas and at low cost and as a result many types of new semiconductor devices have become commercially feasible. A first group of disordered semiconductors are generally equivalent to their crystalline counterparts while a second group manifest physical properties that cannot be achieved with crystalline materials.

As a result of the foregoing, disordered semiconductor materials have come to be widely accepted and a great number of devices manufactured therefrom are in significant commercial use. For example, large area photovoltaic devices are routinely manufactured from amorphous silicon and germanium-based alloys. Such materials and devices are disclosed, for example, in U.S. Pat. Nos. 4,226,898 and 4,217,374 of Ovshinsky et al. Disordered alloy materials have also been used to fabricate photodetector arrays for use in document scanners, cameras and the like. In this regard see U.S. Pat. No. 4,788,594 of Ovshinsky et al. Disordered semiconductor materials have also been used in devices for the high volume storage of optical and electronic data.

It has been found that properties of semiconductor materials in the disordered state will depend upon their morphology and local chemical order and can be affected by various methods of preparation; for example, non-equilibrium manufacturing techniques can provide a local order and/or morphology different from that achieved with equilibrium techniques; and as a result, can change the physical properties of the material. In most instances, an amorphous semiconductor will have a lower electrical conductivity than the corresponding crystalline material and in many instances, the band gap energy, optical absorption coefficient and activation energy of corresponding amorphous and crystalline materials will differ. For example, it has been found that amorphous silicon materials typically have a band gap of approximately 1.6–1.8 eV while crystalline silicon has a band gap of 1.1 eV. It is also important to note that amorphous silicon materials have a direct band gap while the corresponding crystalline material has an indirect band gap and as a result, the optical absorption of amorphous silicon is significantly higher than that of crystalline silicon at or near the band edge. It should also be noted that the dark electrical conductivity of undoped amorphous silicon is several orders of magnitude lower than that of crystalline silicon. It can thus be seen that the various physical properties of silicon strongly depend upon its morphology and local order. Similar relationships are found in a large number of other semiconductor materials.

The principle of the present invention resides in the ability to control the local order of a semi-conductor material from that corresponding to a completely amorphous phase through various other local organizations including intermediate order to a state where the local order is so repetitively periodic that the material is in the single crystalline state. The most important and interesting area of the present invention is the ability conferred thereby to control the local order of a semiconductor material to produce a material which has valuable properties of both the amorphous and crystalline states in a single material. For example, according to the principles of the instant invention, a semi-conductor material having an optical absorption corresponding to that of the amorphous state and transport properties corresponding to those of a crystalline semi-conductor material may be prepared. To do so, the K vector selection rules of the crystalline state must be relaxed so as to remove the constraints from the various phonon mediated properties of the material thereby decoupling them from the morphology of the material.

In accord with the principles of the present invention, decoupling is accomplished by configuring the material as to include clusters of atoms, typically between 12 and 50 angstroms in diameter. The clusters or grains have a degree of order which is different from both the crystalline and amorphous forms of the material. The small size and ordering of the clusters allows them to adjust their band structure to thereby relax K vector selection rules. Practically speaking, the present invention makes possible the manifestation of certain desirable electrical and optical properties of both amorphous and crystalline materials in a single material which may be advantageously manufactured utilizing thin film technology and device configurations.

Even if the ordered clusters of the present invention have excellent electrical properties in and of themselves, the ordered clusters are very small and present in very large numbers in the bulk material. This large number of particles presents a very large surface area which can be a significant source of interfacial disorder which can destroy the advantages gained by the quality of the material constituting the bulk of the ordered clusters. A further subject of the present invention is concerned with the elimination with various interface and impurity states which will inhibit the superior properties of the ordered cluster material. In accord with the principles of the present invention, fluorine is employed to further enhance the properties of the ordered clustered material. Through the use of fluorine, a semi-conductor material, for example silicon or germanium, may be prepared having a very low density of defect states in the gap. This material has excellent optical and electrical properties and may be used in its intrinsic form or may efficiently doped.

Fluorine plays several roles in the preparation of the ordered cluster semi-conductor material of the present invention. Fluorine interacts with the depositing material to permit the nucleation and growth of clusters having the proper size, order and composition. Fluorine cleans the surface of the clusters as they are being deposited by removing weak or otherwise deviant bonded material and by scrubbing away impurities. Fluorine also acts in the bulk of the semi-conductor material constituting the ordered clusters to moderate the bulk electrical properties of the material.

Through the use of the present invention, it is possible to manufacture novel, semi-conductor materials having unique and superior combinations of properties heretofore unavailable in a single material. Through the use of the present invention, an indirect band gap material, such as crystalline silicon may be configured into an ordered cluster material causing it to be an approximate direct band gap material at 1.2 eV. This presents a significant improvement in a variety of electrical devices such as photovoltaic devices. The approximate direct gap ordered cluster silicon material has an optical absorption coefficient which is approximately two-to-four orders of magnitude higher than that of single crystal silicon at 1.2 to 1.5 eV. This allows for the manufacture of photovoltaic devices which are very thin since no more than one micron of semi-conductor material is needed to accomplish the same absorption of light as several hundred microns or more of single crystalline material. In addition to the high absorption, the ordered cluster silicon material retains the low band gap energy and good electrical transport properties of single crystalline silicon.

Fluorine plays several important roles in the deposition of the ordered clustered material of the present invention, in the plasma or vapor state as well as on the surface of the cluster, in the bulk of the clusters and at the interfaces between the clusters. It also is beneficial in reducing the density of defect states in the gap of the material. Fluorine is a very active etchant material and it is generally preferable that it be moderated, for example by dilution with hydrogen.

The present invention resides in, and provides for the ability to decouple and control independently important optical and electrical properties of semi-conductor materials. The present invention improves the performance of any present semi-conductor device and makes possible the manufacture of a variety of novel devices. Accordingly, it will be appreciated that the invention opens a new field of solid state physics in which various heretofore linked properties of semi-conductor materials may be independently and accurately controlled.

The various properties of amorphous and crystalline silicon confer different advantages in various devices. The high mobility of carriers in crystalline silicon is important in high speed semiconductor circuits while the high level of optical absorption of amorphous silicon is ideal for photovoltaic devices since complete light absorption may be accomplished by relatively thin layers of material, making for a lightweight, low cost device. In some instances, one property of a given morphology and local order of semiconductor may be ideal for a particular purpose whereas the value of another property of that same material may not be so well suited. For example, the aforenoted high optical absorption of amorphous silicon is ideal for a photovoltaic device; however, the fairly wide band gap of amorphous silicon does not permit it to address the longer wavelength portions of the solar spectrum. The use of narrower band gap crystalline material in photovoltaic devices increases the portion of the useable spectrum which is addressed and the high conductivity, high mobility and long minority carrier diffusion length in crystalline silicon decreases the series resistance of the photovoltaic device, thereby increasing its overall efficiency; but, the trade-off is that crystalline cells are relatively thick because of their low absorption and hence they are fragile, bulky and expensive.

In accord with the present invention, it has been found that various physical properties of semiconductor materials are decoupled from morphology and local order when those materials are comprised of ordered clusters. As used herein, a semiconductor having ordered clusters shall be defined as a material having a plurality of atomic aggregations of very short range periodicity, and comprised of a plurality of highly ordered, relatively small atomic aggregations, typically extending no more than 50 atomic diameters. The exact dimensions of the ordered clusters in materials of this type will depend upon the particular semiconductor material in question, but typically are they are in the range of 10 to 50 angstroms and preferably about 12 to 30 angstroms in diameter. The ordered clusters have a periodicity and local order differing from an amorphous or fully crystalline material. Heretofore, a number of materials denominated "microcrystalline" have been prepared. These materials typically include crystallites in the range of approximately one hundred angstroms. Such prior art microcrystalline materials do not manifest any decoupling of properties; that is to say, their physical properties cannot be independently controlled. Thus, it will be seen that such prior art materials one differentiated morphologically and phenomenologically from the ordered cluster material of the present invention.

In the ordered clusters, local order is propagated but does not reach the point of becoming long range order; and therefore, lattice constants of the crystalline state do not become the determinative factor of the material's properties. In the ordered clusters, the bond lengths and angles are much more flexible than in materials with long range periodicity. It has been found that in the ordered cluster state of the present invention, materials exhibit a decoupling of their physical properties from morphology and hence they can manifest combinations of properties not present in the same material when it is in a crystalline, polycrystalline, microcrystalline or amorphous state.

This finding is non-obvious since in heretofore employed crystalline, polycrystalline, microcrystalline and amorphous materials, properties such as band gap and conductivity or optical absorption coefficient have been linked. The important finding of the present invention is that once the ordered cluster state is entered, properties can be independently controlled and it is possible to achieve, for example, a silicon material having a narrow band gap and high conductivity corresponding to the crystalline state and a large optical absorption corresponding to the direct gap of the amorphous state. Clearly, this independent control of individual material parameters achieved through the use of ordered cluster materials makes possible a whole new range of novel semiconductor materials and improved devices which heretofore were unavailable.

BRIEF DESCRIPTION OF THE INVENTION

There is disclosed herein a semiconductor body which is in the ordered cluster state and comprises a plurality of ordered clusters of a semiconductor material disposed in electrical communication in the bulk of said body. Also disclosed are various non-equilibrium deposition techniques for preparing the ordered cluster material. The ordered clusters are present in a sufficient number to confer upon said body a pair of physical properties which have values which differ from the values of the same physical properties manifested by a body of the same semiconductor material when it is in a crystalline, polycrystalline, microcrystalline or amorphous state. Typically, the ordered clusters have a diameter of less than 50 angstroms. In one specific embodiment, the ordered clusters are of 12 to 30 angstroms in diameter (See FIG. 4). In one embodiment, the clusters have a local order which results in a relaxation of allowed values for the K vector of the semiconductor material, which thereby manifests an approximately direct gap and a high optical absorption.

The ordered clusters may be disposed in a matrix and the matrix may be of the same or of a different composition as the semiconductor material comprising the ordered clusters and it may be an amorphous matrix.

In one embodiment, the semiconductor material is a silicon-based alloy, a germanium-based alloy or a silicon/germanium-based alloy and may further include elements such as hydrogen, fluorine and dopants. One particular material comprises a silicon material in the ordered cluster state which is characterized by an approximate direct band gap and a band gap energy equivalent to the band gap energy of a crystalline form of the semiconductor material.

One specific ordered cluster material comprises a fluorinated semiconductor body which has an approximately direct band gap and a band gap energy of no more than 1.5 eV and preferably 1.0 to 1.3 eV.

DETAILED DESCRIPTION OF THE INVENTION

The present invention concerns a semiconductor material which in its bulk form includes a number of ordered clusters which may comprise the entirety of the bulk of the material or which may be dispersed in a matrix in sufficient quantity to provide the dominant bulk electrical and/or optical properties of the material. The ordered clusters comprise highly ordered regions of semiconductor material and are of sufficiently small size so that the material is on the threshold of amorphicity and crystallinity and may thus be characterized as "epicrystalline." The unique size range, and local order of the clusters causes the material to be a state of matter which manifests aggregations of electrical, optical and other physical properties which are different than the corresponding properties manifested by the same material when in either the amorphous or crystalline form. The quantitative change in particle size and local order leads to a qualitative change in the overall electrical characteristics of the material.

In the ordered cluster material, the values of at least one pair of physical properties of the material are different from the values of the same pair of physical properties manifested by a body of the same semiconductor material when it is in a crystalline, polycrystalline or amorphous state. The values of each of the properties need not differ from those of the corresponding crystalline, polycrystalline, microcrystalline or amorphous material but it is a characteristic of the ordered cluster material that particular combinations of physical properties are not attainable in any other one material. For example, an ordered cluster material may manifest an optical absorption characteristic of an amorphous material and an electrical conductivity characteristic of the same material when it is in a crystalline state or, a material may have a direct or approximately direct band gap typical of an amorphous semiconductor but a band gap energy equal to that of the same semiconductor when it is in a crystalline form.

Figure 4:
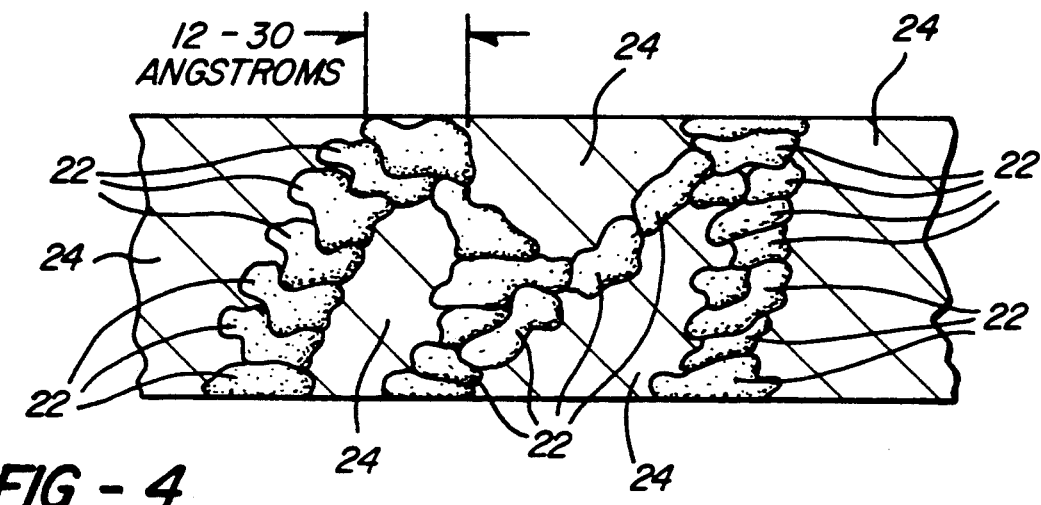
FIG. 4 is a schematic representation of a body of semiconductor material having a plurality of the ordered clusters of the instant invention disposed in the bulk thereof.

The bulk of the body of the ordered cluster semiconductor material may be comprised entirely of ordered clusters or it may include only a percentage thereof (See FIG. 4). However, it is important that the ordered clusters are present in a sufficient number to dominate the electrical and optical properties of the material. For example, the bulk of the material may comprise an amorphous matrix of semiconductor material with ordered cluster dispersed therethrough. If the ordered clusters are present in a sufficient number, percolation theory predicts that they can provide a series of electrical and/or optical paths through the material so that their properties will effectively dominate the bulk of the material. This volume of ordered clusters is referred to as the critical or threshold volume fraction and at this point, the material exhibits a change in properties. This analysis (as described in general terms relative to electrical conductivity herein) is well known to those skilled in solid state theory and may be similarly applied to describe additional physical properties of ordered cluster material such as optical gap, absorption constant, etc. FIG. 4 illustrates schematically a body of semiconductor material, generally 20, having a plurality of the ordered clusters referenced generally by the numeral 22 dispersed throughout said body of semiconductor material. The volume of ordered clusters depicted therein exceeds the aforementioned threshold volume fraction and therefore the material exhibits a change in properties such as electrical conductivity. The ordered clusters are each individually controlled to have a diameter or maximum dimension of 12-30 Angstroms. It should be appreciated that these clusters 22 are disposed in a matrix of semiconductor material which is preferably amorphous 24 and the interfaces therebetween characterized by a reduced density of states due to the fluorination process discussed hereinafter.

The onset of this critical threshold value for the substantial change in the physical properties of materials in the ordered cluster state will depend upon the size, shape and orientation of the particular clusters but it is relatively constant for different types of materials. There exist 1-D, 2-D and 3-D models which predict the volume fraction of clusters necessary to reach the threshold value, and these models are dependent on the shape of the ordered clusters. For example, in a 1-D model (which may be analogized to the flow of charge carrier through a thin wire) the volume fractions of clusters in the matrix must be 100% to reach the threshold value. In the 2-D model (which may be viewed as substantially conically shaped clusters extending through the thickness of the matrix) the volume fraction must be about 45% to reach the threshold value, and finally the 3-D model (which may be viewed as substantially spherical clusters in a sea of matrix material) the volume fraction need only be about 16–19% to reach the threshold value. Therefore, various materials classified as crystalline, polycrystalline or amorphous by others in the field, may include sufficient ordered clusters so as to decouple the various physical properties thereof and render the bulk in the ordered cluster state as defined herein.

Figure 1A:
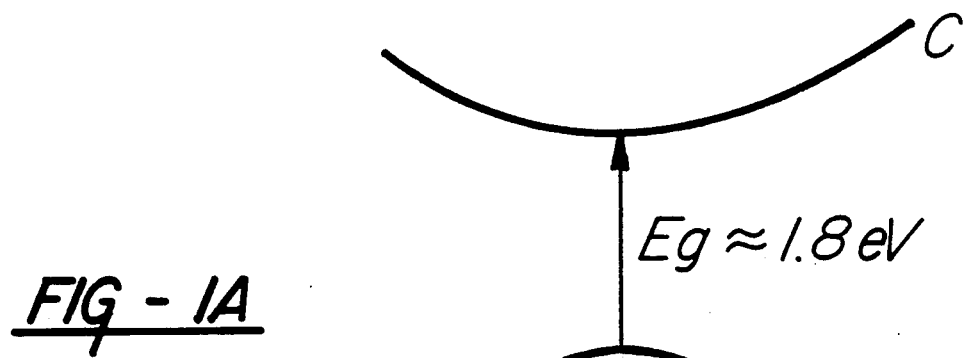
FIG. 1A is a depiction of the band structure of amorphous silicon.

A band gap is a characteristic of a semiconductor material and the nature and magnitude of the gap determines the properties of the semiconductor. As was mentioned hereinabove, amorphous silicon is characterized by a direct band gap and crystalline by indirect band gap; whereas, the ordered cluster material of the present invention may be described as manifesting, in some instances, an approximate direct band gap. Referring now to FIG. 1A, there is shown a schematic depiction of the band structure of amorphous silicon. As is well known to those of skill in solid state physics, the band structure comprises a valence band, labeled V and a conduction band labeled C. These bands correspond to allowed states in which electrons can exist. The valence band generally corresponds to those electrons associated strongly with particular atoms and the conduction band with electrons free to carry charge. In a semiconductor, the two bands are separated by a gap, called the forbidden zone. In order to carry charge, an electron must make the transition from the valence to the conduction band and to do so must obtain an energy in excess of the gap energy. In the band diagram of FIG. 1A, amorphous silicon is depicted as having a band gap energy of approximately 1.8 electron volts, and a charge carrier needs an energy of at least 1.8 eV to cross the gap. This energy may be obtained, for example, by the absorption of a sufficiently energetic photon. The gap of amorphous silicon is what is termed a direct band gap. That is to say a charge carrier passing from the valence to the conduction band may do so in a one step process.

Figure 1B:
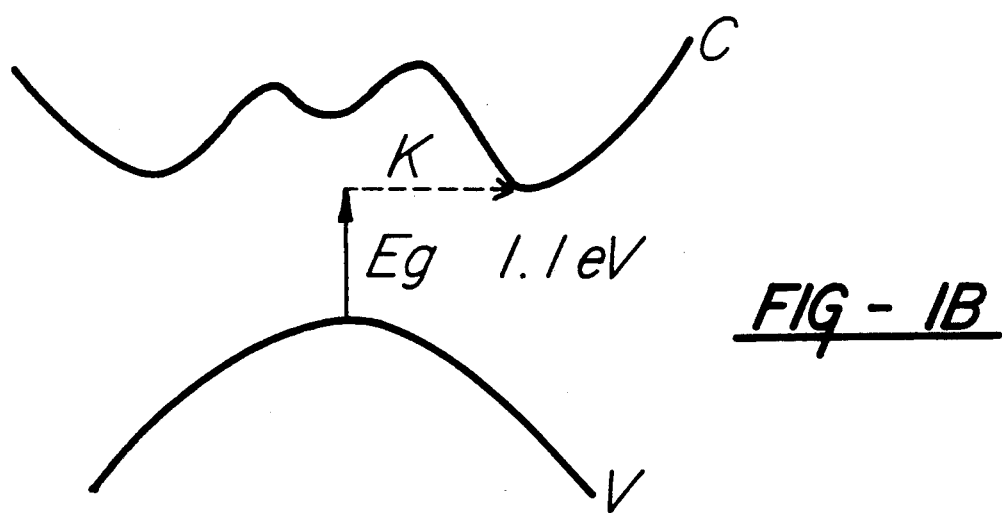
FIG. 1B is a depiction of the band structure of crystalline silicon.

Referring now to FIG. 1B, there is shown the band structure for crystalline silicon. It will be noted that the conduction band has a somewhat more complex shape than does that of amorphous silicon. Crystalline silicon is an indirect gap material. A charge carrier cannot pass directly from the valence to the conduction band unassisted. The process is mediated by a phonon. In the band diagram of FIG. 1B, it will be seen that a carrier is first energized to a level approximately 1.1 electron volts above the valence band and then interacts with a phonon to make the transition to a low point of the conduction band. The energy of the phonon is represented by a term called the K vector. Because of the highly periodic structure of crystalline silicon, the K vector is confined to a very narrow and particular range of values; hence, it will be appreciated that band-to-band transitions are much more difficult in crystalline silicon than in amorphous silicon. This fact is reflected in the practical observation that amorphous silicon is a far better absorber of light than is crystalline silicon. In fact, the optical absorption coefficient for amorphous silicon is 2–4 orders of magnitude higher than for crystalline silicon. It is for this reason that amorphous silicon photoresponsive devices such as photovoltaic devices, photosensors and the like are far thinner than similar crystalline devices.

In the ordered cluster material of the present invention, K vector constraints are relaxed. The ordered clusters have a periodic structure but they are of relatively small size and are possessed of a local order which relaxes K vector selection rules. In the ordered cluster material there exists a range of values which the K vector may assume; and hence, transitions from the valence to the conduction band are statistically more favored. For this reason, the ordered cluster material manifests an optical absorption at or near the band edge which is significantly higher than that of the indirect band gap, crystalline material. This behavior is referred to herein as an "approximate direct band gap" to make clear the fact that while the process is to some degree phonon mediated, the net behavior is very similar to that of a direct band gap both electrically and optically.

Figure 2:
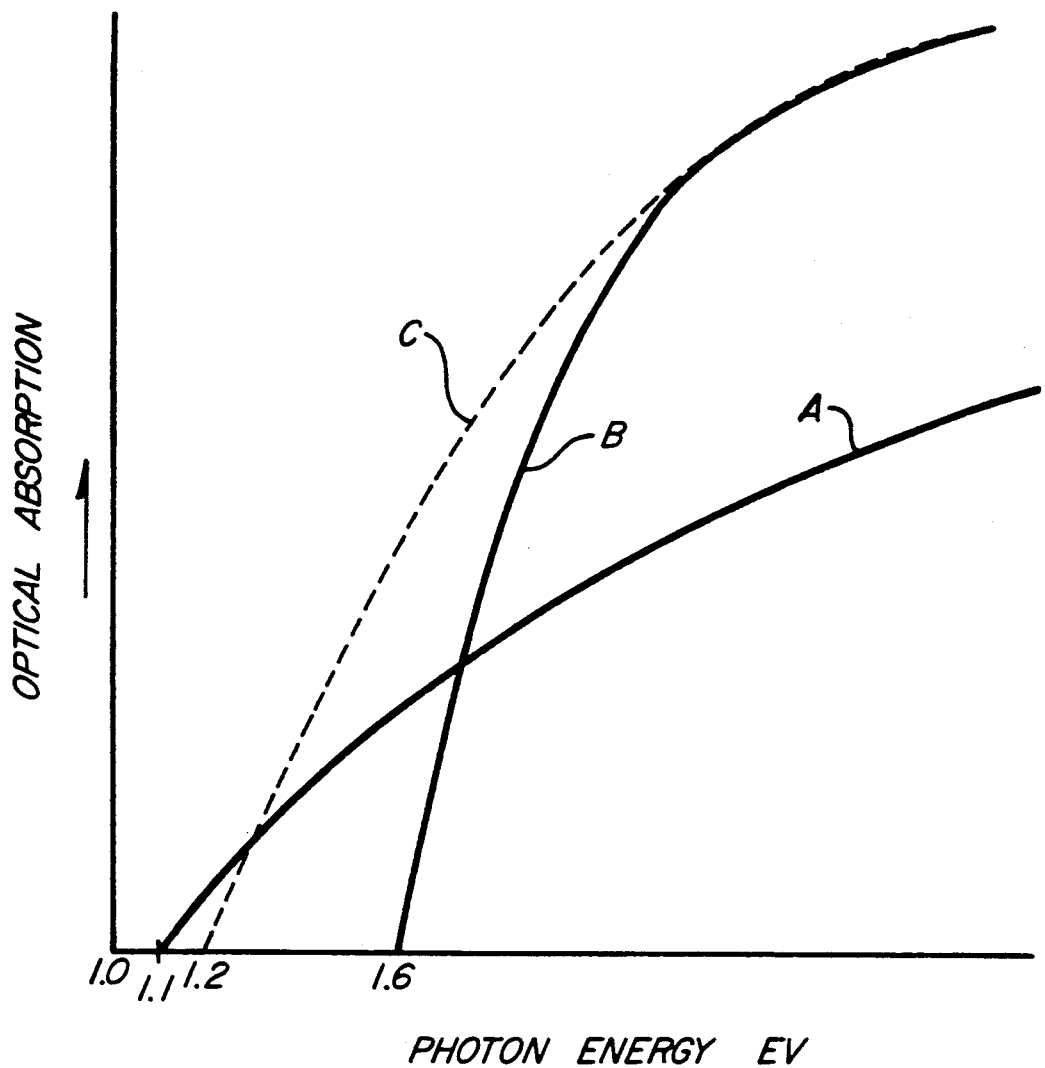
FIG. 2 is a plot of optical absorption versus photon energy for amorphous silicon, crystalline silicon and ordered cluster silicon.

Referring now to FIG. 2, there is shown a graphic representation of optical absorption as a function of photon energy for a representative ordered cluster silicon material of the present invention and for the corresponding amorphous and crystalline materials. Specifically, the graph of FIG. 2 plots photon energy in terms of electron volts versus optical absorption. Curve A represents the behavior of a typical, indirect gap crystalline silicon material. As determined by the plot of FIG. 2, the crystalline material of has a band gap of approximately 1.1 eV. Curve B represents a corresponding direct gap amorphous silicon material and this material has a band gap of approximately 1.6 eV. It will be noted from the figure that the amorphous material has a generally higher overall absorption than does the crystalline material and this behavior is attributable to the fact that the amorphous material has a direct band gap while the crystalline material has an indirect band gap. Curve C represents the approximate direct gap, ordered cluster material of the present invention. For the higher energy portions of the spectrum, the optical absorption of the ordered cluster material is similar to that of the amorphous material. At somewhat lower photon energies, curve C diverges from curve B and according to the plot of FIG. 1, the ordered cluster material has a band gap of approximately 1.2 eV and a far higher optical absorption than crystalline silicon. It will thus be seen that in the ordered cluster material of curve C, the K vector constraints have been relaxed to provide approximate direct gap conduction. The material has the high optical absorption characteristic of a direct gap material together with the narrow band gap of a crystalline material and constitutes a new state of matter.

There are a variety of methods by which the materials of the present invention may be prepared. The most preferred are various of the thin film deposition techniques including laser ablation sputtering, chemical vapor deposition, plasma deposition processes, and evaporation processes. The critical element of any deposition process is the control of crystallite size so as to keep the material in the ordered cluster regime. In general, processes of fairly slow growth on a very large number of nuclei will produce a bulk semiconductor material having large number of ordered clusters therein. For example, in a plasma deposition process, a forward reaction takes place in which a precursor gas species, such as silane is decomposed to yield a solid deposit such as silicon. This process also includes a reverse reaction wherein hydrogen liberated from the silane reacts with the newly deposited silicon to etch away that silicon and regenerate the gaseous species. Deposition rate is a function of the balance of the forward and reverse reactions. In this example, etching is accomplished by hydrogen provided by decomposition of the silane. Addition of extra etchant material, i.e., more hydrogen, speeds up the etching process and thereby slows the rate of deposition and enhances ordered cluster growth. In addition to, or instead of the foregoing, other etchant species such as fluorine may be added to the process to similarly moderate deposition rates.

It has been found that enhancement of etching and concomitant slowing of deposition, as for example by the inclusion of extra hydrogen or fluorine into a silicon deposition atmosphere, functions to initially increase crystallite size but at some point, the presence of additional etching species slows the rate of growth sufficiently so that the generation of additional nucleating sites for crystal growth predominates over the rate of crystalline growth and many, small ordered clusters are nucleated. The use of a relatively low substrate temperature further slows the rate and enhances ordered cluster growth.

While fluorine functions as an etchant material to moderate crystal growth and hence allow for the preparation of the ordered cluster material of the present invention, the effects of fluorine extend beyond its role as a simple etchant. Fluorine is a superhalogen and as such exerts effects not attainable by the use of and amount of hydrogen or other halogens in the deposition atmosphere. Fluorine acts to provide a different, and improved, local order in the material and to control the size and morphology of the clusters. Fluorine also reacts with deviant morphological and electrical states as they are formed in the material.

Because of the large surface area presented by the ordered clusters, surface electronic effects are very significant in these materials and fluorine acts to remove and/or passivate surface states, thereby allowing the bulk properties of the ordered cluster materials to predominate. Fluorine also acts as a modifier and to improve the local order and thereby influence the bulk physical properties of the material. In general, through the use of fluorine, surface and bulk states are neutralized and the local order is improved so as to provide a semiconductor material in the ordered cluster state, having a low density of defect states in the band gap and hence superior semiconductor properties.

A series of specific ordered cluster materials were prepared in accord with the present invention by a glow discharge deposition process, also referred to in the art as a plasma-assisted CVD process. The process, as is well known to those of skill in the art, involves the decomposition of a low pressure feed gas by means of a plasma established therein through the action of an electrical field. The decomposition produces various species which deposit a semiconductor film on a substrate, typically maintained at an elevated temperature proximate the plasma.

In the following experimental series, the deposition process was carried out in a vacuum chamber maintained at approximately 0.3–0.4 torr. Atmospheres of various gas mixtures, as will be noted, were maintained in the chamber and a plasma established by energization of a cathode with radio frequency energy of 1356 MHz. Deposition occurred on substrates maintained at approximately 250° C. The data from the experimental series is summarized in Table 1 below.

TABLE 1

| Sample | Gas Mixture | $E_a$ | Conductivity | Photoconductivity |
|---|---|---|---|---|
| 1 | 2% SiH$_4$ + 1% PH$_3$ | — | $1.4 \times 10^{-1}$ | — |
| 2 | 2% SiH$_4$ | .31 | $1.7 \times 10^{-4}$ | $3 \times 10^{-5}$ |
| 3 | 1% SiH$_4$ | .47 | $4 \times 10^{-6}$ | $1.4 \times 10^{-5}$ |
| 4 | 2% SiH$_4$ SiF$_4$ | .61 | $1.5 \times 10^{-7}$ | $2.8 \times 10^{-6}$ |

The first sample in the Table represents a doped ordered cluster silicon material formed from a gas mixture comprising 2% silane and 1% phosphine dopant in hydrogen. The material was heavily doped and manifested a high electrical conductivity and consequently, activation energy and photoconductivity were not measured.

Sample 2 represented a deposition from a gas mixture basically similar to that of sample 1 but excluding the dopant. This material had a low activation energy and manifested a photoconductive effect. The ability to dope the material, as is evidenced by a comparison of the data of samples 1 and 2, indicates that the material possesses a band gap having a low defect density. Sample 3 represents a material prepared from a gas mixture including 1% silane in hydrogen and it will be noted that the material also has a low activation energy and manifests a photoconductive effect. Sample 4 represents an ordered cluster material prepared from 2% of a 50:50 mixture of silane and silicon tetrafluoride in hydrogen and demonstrates the effect of fluorine on the material. The activation energy is low and a photoconductive effect is manifested.

By the use of the present invention, it is clear that silicon-based material having high optical absorption and a low band gap may be prepared in thin film form.

The use of such low band gap material clearly confers advantages in a variety of semiconductor devices, particularly photovoltaic devices. Since it allows a thin photovoltaic device to capture a large portion of the solar spectrum. The availability of low band gap high absorption, thin film silicon alloy material precludes the need to use germanium or germanium-silicon alloy materials in photovoltaic devices; although it is to be understood that the principles of the present invention may be applied to germanium and other semiconductors.

Figure 3:
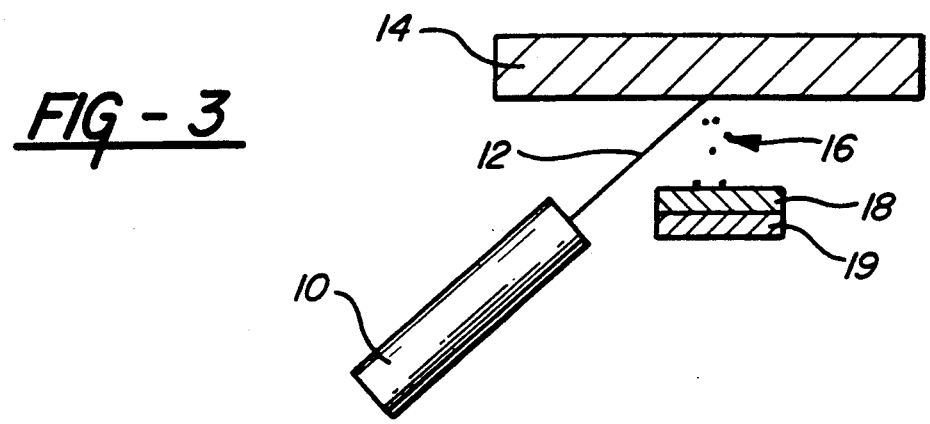
FIG. 3 is a schematic depiction of a laser ablation apparatus as adapted to prepare the ordered cluster material of the present invention.

As noted hereinabove, other deposition processes may be employed to prepare the ordered cluster material of the present invention. Referring now to FIG. 3 there is shown in schematic form, a laser ablation technique for depositing semiconductor material in the ordered cluster state. The apparatus of FIG. 2 comprises a laser, such as a yag laser 10 disposed so as to project a beam of light 12 onto a body of deposition material 14. Irradiation of the deposition material 14 by the intense laser beam 12 causes a portion of the surface of the body 14 to ablate away. The ablated material 16 condenses on a substrate 18 which is typically maintained at an elevated temperature. In a technique such as that illustrated in FIG. 3, the rate of deposition is controlled by the intensity of the laser beam 12, the rate at which the beam is fired and by the temperature of the substrate. In a process for the deposition of an ordered cluster silicon material, the target 14 is manufactured from a body of silicon and may be prepared by pressing a powdered material or fusing material in a crucible or the like. Dopant materials, modifiers and other elements may be added directly to the silicon target 14 as it is being prepared or they may be present in the gaseous atmosphere of the deposition apparatus.

As in the foregoing examples, it has been found advantageous to include fluorine in the deposition atmosphere and in the process of FIG. 3, the fluorine may be incorporated directly into the target 14, for example, in the form of a fluorine compound or it may be present in the background atmosphere. In a typical process, the apparatus is housed in a vacuum chamber enclosing a hydrogen and/or fluorine atmosphere maintained at a pressure of 10 m torr. The laser is a yag laser operating to produce an energy density of approximately 10 joules/CM$^2$ at the surface of the target 14. Typically, the laser is fired at a repetition rate of between 1 and 10 hertz. The substrate 18 is supported by a substrate holder 19 which is typically maintained at an elevated temperature of approximately 250°-350° C. and the substrate 18 itself is generally at a temperature 50°-75° lower. It has been found that these operating conditions will provide a body of semiconductor material having properties generally similar to those described hereinabove.

There are a number of processes and conditions under which the ordered cluster material of the present invention may be prepared. In general, growth of high quality material is favored by conditions near a dynamic equilibrium point wherein film growth and etching tendencies are such that many, very small, growth sites are nucleated. It has been found advantageous in some instances to employ high vacuum deposition conditions, typically at pressures of $10^{-6}$ torr and preferably less than $10^{-8}$ torr. Use of high vacuum conditions precludes contamination of the semiconductor body. Fluorine acts in the plasma or vapor phase to alter the free radical composition and the chemistry of the depositing species and it acts in the bulk of the material to optimize local order. The ordered cluster materials of the present invention are possessed of a low band gap, a high optical absorption and the ease with which they may be doped demonstrates that their band gaps have a low defect density.

The ordered cluster semiconductors of the present invention may be prepared from a large number of materials and they are applicable to a wide variety of semiconductor devices. While the foregoing discussion was primarily concerned with silicon alloy devices for photovoltaic applications, it will be appreciated that the principles herein disclosed may be similarly extended to other semiconductor materials and other types of devices. The foregoing drawings, discussion and description are not meant to be limitations upon the practice of the present invention but illustrations thereof. It is the following claims, including all equivalents, which define the scope of the invention.

We claim:

1. A semiconductor body in the ordered cluster state, comprising a plurality of ordered clusters of a semiconductor material disposed in electrical communication in the bulk of said body, said ordered clusters having a diameter in the range of 12 to 30 Angstroms and being present in a sufficient number to confer upon said body a pair of physical properties which have values which differ from the values of the same physical properties manifested by a body of the same semiconductor material when it is in a crystalline, polycrystalline, microcrystalline or amorphous state; said pair of physical properties selected from the group consisting of band gap energy, optical absorption coefficient, activation energy and conductivity.

2. A semiconductor body as in claim 1, wherein the K vector thereof is relaxed so that the number of allowed photon-mediated band to band transitions is greater than in the corresponding crystalline material, and the optical absorption coefficient is greater than in the corresponding crystalline material.

3. A semiconductor body as in claim 1, wherein said ordered clusters are disposed in a matrix.

4. A semiconductor body as in claim 3, wherein said matrix is of essentially the same composition as said semiconductor material.

5. A semiconductor body as in claim 3, wherein said matrix is amorphous.

6. A semiconductor body as in claim 1, wherein said semiconductor material comprises silicon.

7. A semiconductor body as in claim 6, wherein said semiconductor material further includes hydrogen.

8. A semiconductor body as in claim 6, wherein said semiconductor material further includes fluorine.

9. A semiconductor body as in claim 1, wherein said semiconductor material further includes a dopant.

10. A semiconductor body as in claim 1, wherein said semiconductor material is a silicon based material, said semiconductor body having an approximate direct band gap and a band gap energy of approximately 1.0–1.5 eV.

11. A semiconductor body as in claim 1, wherein said semiconductor material is a germanium based material.

12. A semiconductor body as in claim 11, wherein said semiconductor material further includes hydrogen therein.

13. A semiconductor body as in claim 11, wherein said semiconductor material further includes fluorine therein.

14. A semiconductor body as in claim 11, wherein said semiconductor material further includes a dopant therein.

15. A semiconductor body as in claim 1, wherein said semiconductor material is a silicon/germanium alloy material.

16. A semiconductor body as in claim 1, wherein said ordered clusters include fluorine.

17. A semiconductor body as in claim 16, wherein said fluorine is present at least at the surfaces of said ordered clusters, whereby said semiconductor body is characterized by a reduction in interfacial states compared to a fluorine-free semiconductor body.

18. A semiconductor body as in claim 1, said body including a plurality of ordered clusters of a fluorinated silicon alloy material disposed in electrical communication in the bulk of the semiconductor body, said body having an approximate direct band gap and a band gap energy of no more than 1.5 eV.

* * * * *